United States Patent
Tsunai (10) Patent No.: US 6,720,593 B2
(45) Date of Patent: Apr. 13, 2004

(54) CHARGE-COUPLED DEVICE HAVING A REDUCED WIDTH FOR BARRIER SECTIONS IN A TRANSFER CHANNEL

(75) Inventor: Shiro Tsunai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/430,068

(22) Filed: May 6, 2003

(65) Prior Publication Data

US 2003/0213983 A1 Nov. 20, 2003

(30) Foreign Application Priority Data

May 15, 2002 (JP) .............................. 2002-139820

(51) Int. Cl.[7] ................. H01L 27/148; H01L 29/768
(52) U.S. Cl. ................. 257/240; 257/246; 257/248; 257/249; 257/250
(58) Field of Search ................. 257/240, 246, 257/248, 249, 250

(56) References Cited

U.S. PATENT DOCUMENTS 3,890,633 A * 6/1975 Kosonocky ............... 257/231
5,175,602 A * 12/1992 Nam ........................ 257/216
6,218,686 B1 * 4/2001 Nam ........................ 257/250

* cited by examiner

Primary Examiner—Ngân V. Ngô
(74) Attorney, Agent, or Firm—Scully, Scott, Murphy & Presser

(57) ABSTRACT

A charge-coupled device (CCD) includes first-level transfer electrodes and second-level transfer electrodes alternately arranged along a transfer channel, wherein charge storage sections underlying the first-level transfer electrodes have a larger width than barrier sections underlying the second-level transfer electrodes. First and second interconnect lines supply two-phase driving signals to the transfer electrodes. Contact plugs connecting the first interconnect line to the transfer electrodes and contact plugs connecting the second interconnect line are located at opposite sides with respect to the center line of the transfer channel.

7 Claims, 9 Drawing Sheets

CHARGE-COUPLED DEVICE HAVING A REDUCED WIDTH FOR BARRIER SECTIONS IN A TRANSFER CHANNEL

BACKGROUND OF THE INVENTION (a) Field of the Invention

The present invention relates to a charge-coupled device (CCD) having a reduced width for barrier sections in a transfer channel and thus suited to a finer structure of the CCD.

(b) Description of the Related Art

In a recent solid-state imaging device including a CCD, the dimensions of the pixels are more and more reduced to have a finer structure, whereby the CCD therein is also requested to have a smaller width. The width of the CCD is an important factor which determines the amount of electrons (or electric charge) to be transferred in the solid-state imaging device, and a larger width of the CCD allows the CCD to transfer a lager amount of electrons therein and to afford an improved image quality for the solid-state imaging device.

Figure 14:
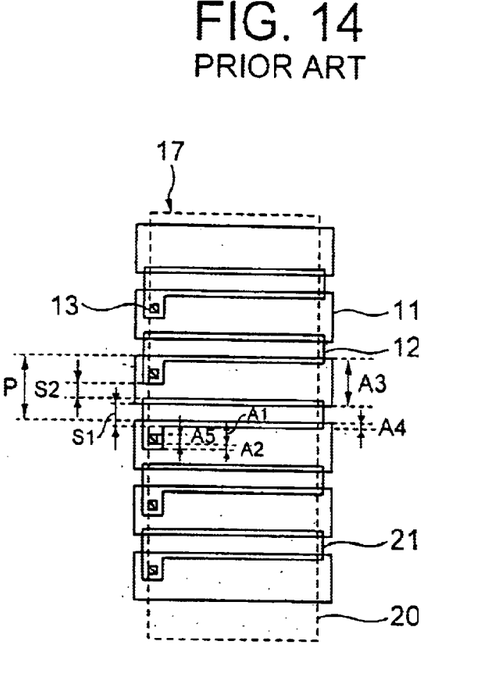
FIG. 14 is a top plan view of a conventional CCD.

FIG. 14 shows the structure of transfer electrodes in a conventional CCD in a top plan view. The CCD includes a plurality of first-level transfer electrodes 11 and a plurality of second-level transfer electrodes 12, which are alternately arranged along a transfer channel 17 to transfer electric charge within the transfer channel 17. The transfer channel 17 includes therein an n-well 20 heavily doped with n-type impurities and underlying the electrodes 11 and 12. A first group of pairs each including one of the first-level transfer electrodes 11 and an adjacent one of the second-level transfer electrodes 12 and a second group of pairs each including another of the first-level transfer electrodes 11 and adjacent another of the second-level transfer electrodes 12 are alternately arranged along the transfer channel 17. The first group of pairs are connected to a first interconnect line, whereas the second group of pairs are connected to a second interconnect line.

Figure 15:
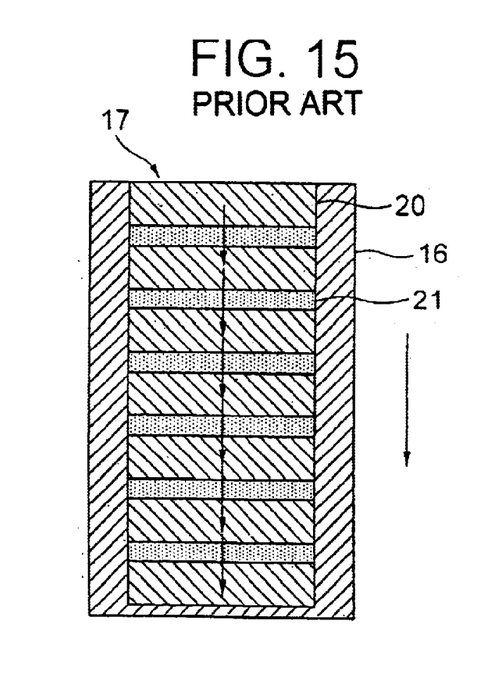
FIG. 15 is a top plan view of the transfer channel underlying the structure shown in FIG. 14.

FIG. 15 shows the underlying transfer channel 17 in a top plan view. The transfer channel 17 is encircled by a p-well, and includes an n-well 20 heavily doped with impurities and a plurality of stripe $n^-$-wells 21 lightly doped with impurities and arranged along the transfer channel 17. The $n^-$-wells 21 are formed on the surface regions of the n-well 20. The portions of the n-well 20 exposed from the $n^-$-wells 21 underlie the first-level transfer electrodes 11, whereas the $n^-$-wells 20 underlie the second-level transfer electrodes 12. The electric charge is transferred along the transfer channel 17 in the direction of the arrows depicted.

Figure 16:
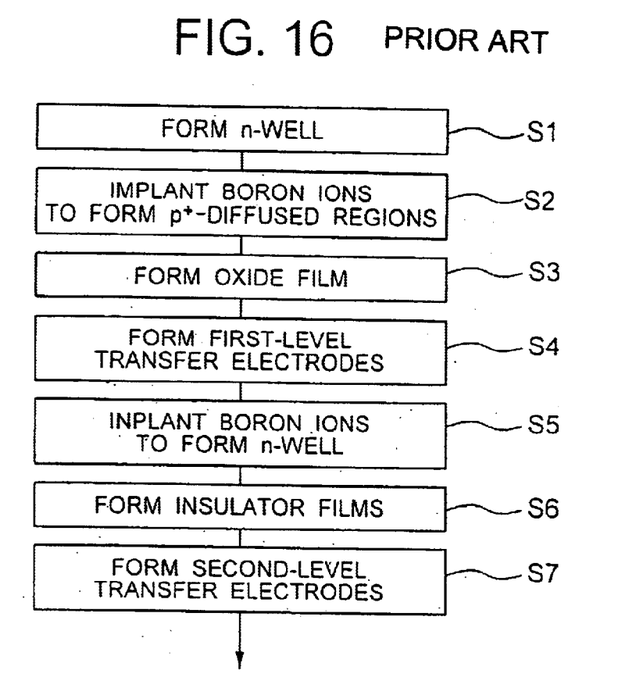
FIG. 16 is a flowchart of a process for manufacturing the CCD of FIG. 15.

FIG. 16 shows a flowchart of the process for manufacturing the CCD shown in FIG. 14. The n-well 20 of the transfer channel 17 is first formed within a p-well formed in a semiconductor substrate (step S1), followed by implantation of boron ions into the peripheral area of the transfer channel 17 to form the $p^+$-diffused region (step S2). Thereafter, an oxide film is formed over the entire surface of the substrate (step S3), followed by depositing a first polysilicon film and patterning thereof to thereby form the first-level transfer electrodes 11 (step S4). Subsequently, boron ions are implanted into surface regions of the n-well 20 in a self-alignment technique using the first-level transfer electrodes 11 as a mask, thereby selectively changing the surface regions of the n-well 21 to the $n^-$-wells 21 (step S5). Thereafter, an oxide film and an inter-level dielectric film are formed (step S6), followed by depositing a second polysilicon film and patterning thereof to form the second-level transfer electrodes 12 (step S7).

As shown in FIG. 14, it is assumed that P, S1, S2, A1, A2, A3, A4 and A5 are pitch of the combination transfer electrodes 11 and 12, space between adjacent two first-level transfer electrodes 11, space between adjacent two second-level transfer electrodes 12, distance between the contact plug 13 and the edge of the corresponding first-level transfer electrode 11, distance between the contact plug 13 and the edge of the corresponding second-level transfer electrode 12, width of the first-level transfer electrodes 11, dimension of the overlapped portion between the first-level transfer electrode 11 and the corresponding second-level transfer electrode 12 and width of the contact plugs 13, respectively.

In the design of the CCD shown in FIG. 14, the above pitch P, spaces S1 and S2, distances A1 and A2, width A3, dimension A4 and width A5 are determined in consideration of the design margin so that the pitch P satisfies the following relationship:

$$P \geq S1+S2+A1+A2+A4+A5.$$

This relationship, if satisfied, allows the CCD to have the overall configuration shown in FIG. 14. However, due to the recent development of smaller dimensions for the pixels of CCD, it is desired that the pitch P of the combination transfer electrodes be equal to or below 2 µm, which fact renders the employment of configuration shown in FIG. 14 to be difficult.

Figure 17:
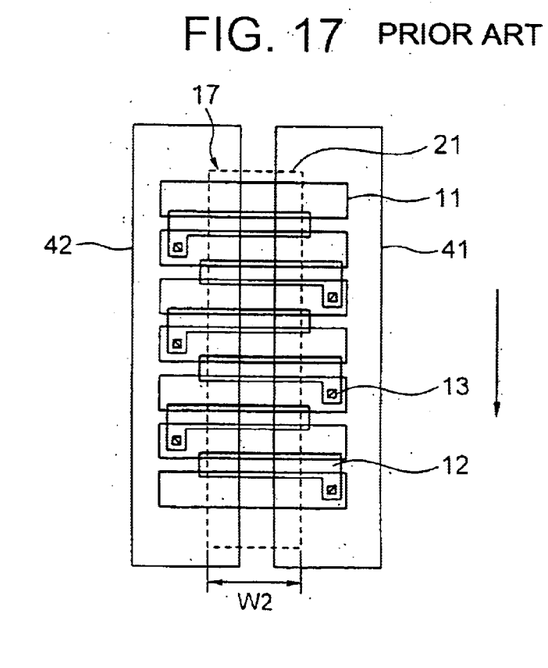
FIG. 17 is a top plan view of a comparative example of CCD in the present invention.
Figure 18:
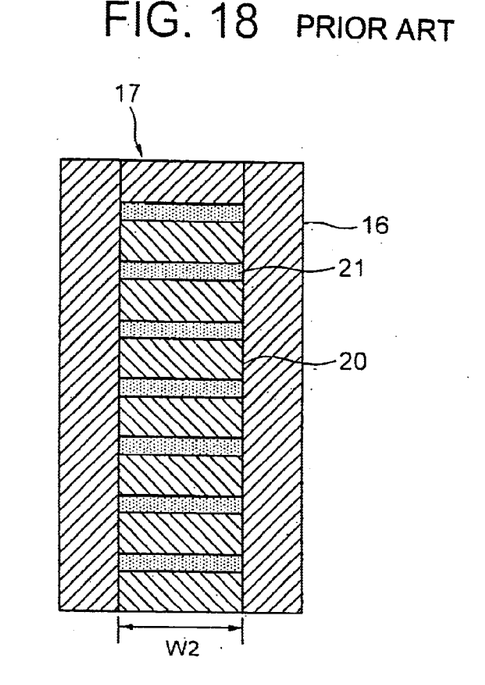
FIG. 18 is a top plan view of the transfer channel underlying the structure shown in FIG. 17.

It may be considered that such a small-dimension CCD should have the configuration shown in FIG. 17 and FIG. 18, which show the structure of the CCD similarly to FIGS. 14 and 15, respectively. In the depicted structure, the contact plugs 13 connecting the first interconnect line 41 and the corresponding transfer electrodes 11 and 12 in the first group are disposed in the vicinity of one edge of the transfer channel 17 opposite to the edge, in the vicinity of which the contact plugs 13 connecting the second interconnect line 42 and the corresponding transfer electrodes 11 and 12 in the second group are disposed. In other words, the contact plugs 13 are arranged in a staggered configuration with respect to the center of the transfer channel 17. This structure may allow the design margin in the patterning for the contact plugs 13 to be reduced to reduce the pitch P of the combination transfer electrodes. However, this structure has a disadvantage in that the width (W2) of the transfer channel 17 is reduced, as shown in FIGS. 18 and 19, whereby the maximum electric charge to be transferred by the transfer channel 17 is also reduced.

Figure 19:
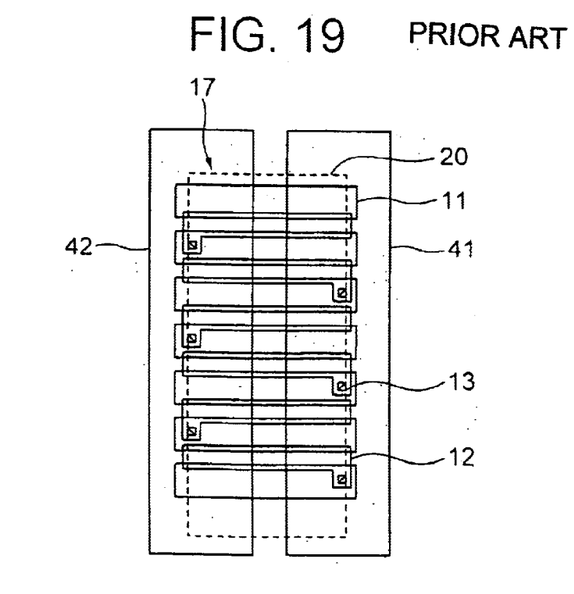
FIG. 19 is a top plan view of another comparative example of CCD in the present invention.

In order to assure a sufficient width for the transfer channel 17, another structure such as shown in FIG. 19 may be considered. However, this structure requires a sufficient space between adjacent two second-level transfer electrodes 12 for assuring an equal width for the second-level transfer electrode 12 and the barrier section or $n^-$-well. This results in a larger pitch P for the transfer channel, and thus is not suitable.

SUMMARY OF THE INVENTION

In view of the above, it is an object of the present invention to provide a CCD having a reduced pitch P for the combination transfer electrodes and a width sufficient for transferring an adequate amount of electric charge, irrespective of the CCD being designed in a design rule similar to the conventional design rule and manufactured by a process similar to the conventional process.

The present invention provides a charge-coupled device (CCD) including: a semiconductor substrate having therein a transfer channel on a surface region of the semiconductor substrate; a plurality of first transfer electrodes and a plurality of second transfer electrodes overlying the semiconductor substrate and alternately arranged along the transfer channel; and first and second interconnect lines for supplying two-phase driving signals to the first and second transfer electrodes to transfer electric charge along the transfer channel, wherein: the transfer channel includes a plurality of first diffused regions each underlying a corresponding one of the first transfer electrodes and a plurality second diffused regions each underlying a corresponding one of the second transfer electrodes, the first diffused regions constituting charge storage sections and the second diffused regions constituting barrier sections during transferring the electric charge; and each of the charge storage sections has a width larger than a width of each of the barrier sections.

In accordance with the CCD of the present invention, by allowing the width of the barrier sections to be smaller than the width of the charge storage sections, the second transfer electrodes overlying the barrier sections may have a smaller width whereby the pitch of the combination transfer electrodes can be reduced in the staggered arrangement of the contact plugs. The smaller width of the barrier sections does not substantially reduce the maximum amount of electric charge transferred by the transfer channel because the maximum amount is determined by the width of the charge storage sections and scarcely by the width of the barrier sections.

The present invention also provides a method for manufacturing the CCD of the present invention, the method including the step of selectively implanting impurities in the charge storage section in a self-alignment technique using the first transfer electrodes as a mask to form the barrier sections.

In accordance with the method of the present invention, the self-alignment technique using the transistor electrodes reduces the number of photolithographic steps in the manufacture of the CCD while assuring an accurate selectivity.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings, wherein similar constituent elements are designated by similar reference numerals throughout the drawings.

Figure 1:
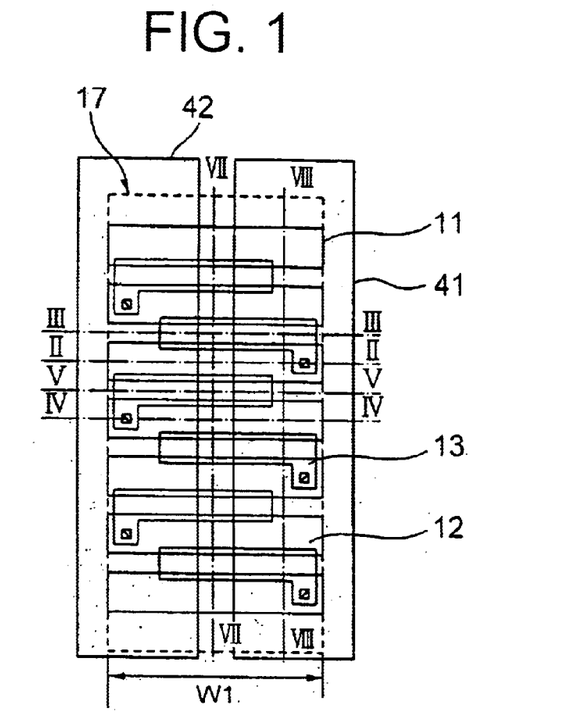
FIG. 1 is a top plan view of a CCD according to a first embodiment of the present invention.

Referring to FIG. 1, a CCD according to a first embodiment of the present invention includes a plurality of first-level transfer electrodes 11, a plurality of second-level transfer electrodes 12, and a transfer channel 17 including an n-well 20 and a plurality of n$^-$-wells 21 formed on the surface regions of the n-well 20. First and second interconnect lines 41 and 42 formed in a common layer supply two-phase driving voltages to the first and second-level transfer electrodes 11 and 12. Contact plugs 13 connecting the interconnect lines 41 and 42 and the transfer electrodes 11 and 12 are arranged in a staggered configuration, and disposed in the vicinities of the opposing edges of the transfer channel 17, as understood from the drawing.

A first group of pairs each including a first-level transfer electrode 11 and an adjacent second-level transfer electrode 12 are connected to the first interconnect line 41 via the contact plugs 13 disposed in the vicinities of one edge (right side in FIG. 1) of the transfer channel 17. A plurality of second group of pairs each including a first-level transfer electrode 11 and an adjacent second-level transfer electrode 12 are connected to the second interconnect line 42 via the contact plugs 13 disposed in the vicinities of the other edge of the transfer channel 17. The first group of pairs and the second group of pairs are disposed alternately along the transfer direction of the transfer channel 17. By applying a pair of clock pulse trains to the interconnect lines 41 and 42, respectively, the CCD is driven in a two-phase driving scheme, wherein the clock pulse trains have opposite phases with respect to one another. In the example of FIG. 1, the electric charge is transferred from the top toward the bottom.

Figure 2:
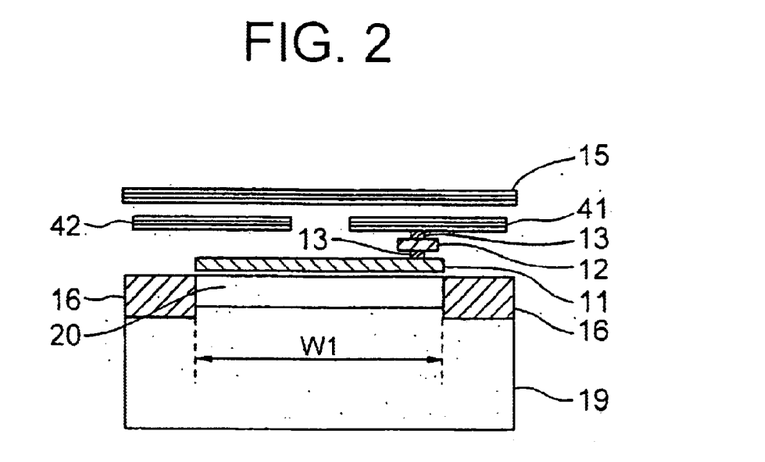
FIG. 2 is a sectional view taken along line II—II in FIG. 1.

FIG. 2 is taken along line II—II in FIG. 1 for showing the cross section of the first-level transfer electrode 11 in one of the pairs in the first group (referred to as "first pair" hereinafter), wherein the first interconnect line 41 is connected to the first-level transfer electrode 11 and the second-level transfer electrode 12 of the first pair via contact plugs 13. A metallic film 15 overlies the interconnect lines 41 and 42 for shielding the interconnect lines 41 and 42 against the top light. The n-well 20 temporarily stores therein electric charge during transferring the same, and has a width W1 which is equal to the width of the first-level transfer electrodes 11. Insulator films (not shown) are disposed to electrically isolate the interconnect lines 41 and 42 from the first and second-level transfer electrodes 11 and 12, and isolate the first-level transfer electrodes 11 from the second-level transfer electrodes 12, the latter being also isolated from a silicon substrate 19 by another insulator film (not shown).

Although the CCD is formed on the p-well 19 in the present embodiment, the CCD may be formed directly on a p-type substrate. The CCD may be formed on a p-well formed on an n-type substrate. In addition, these conductivity types are exemplified and may be modified with reference to known techniques.

Figure 3:
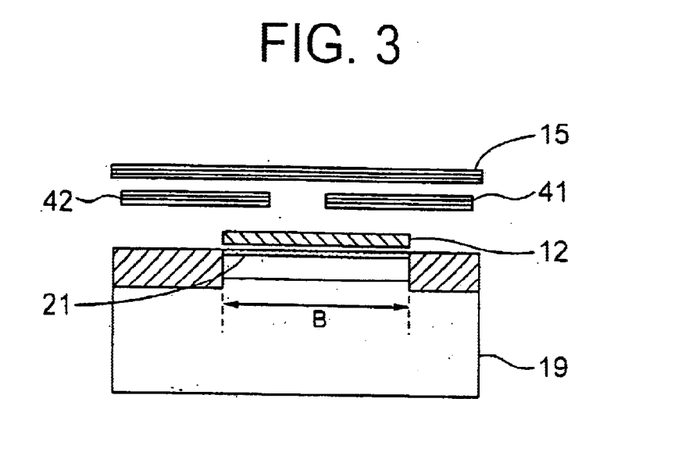
FIG. 3 is a sectional view taken along line III—III in FIG. 1.

FIG. 3 is taken along line III—III in FIG. 1 for showing the section of the second-level transfer electrode 12 in the first pair, which overlaps the corresponding first-level transfer electrode 11 at the portion depicted in FIG. 2 and connected to the first interconnect line 41. In FIG. 3, a barrier section formed as the n⁻-well 21 is depicted, which transfers the electric charge without storing the same and has a width "B" equal to the width of the second-level transfer electrode 12. The n⁻-well, or barrier section 21 has a smaller width "B" compared to the width W1 of the n-well 20 in view that the n⁻-well 21 does not store the electric charge during transferring the electric charge.

Figure 4:
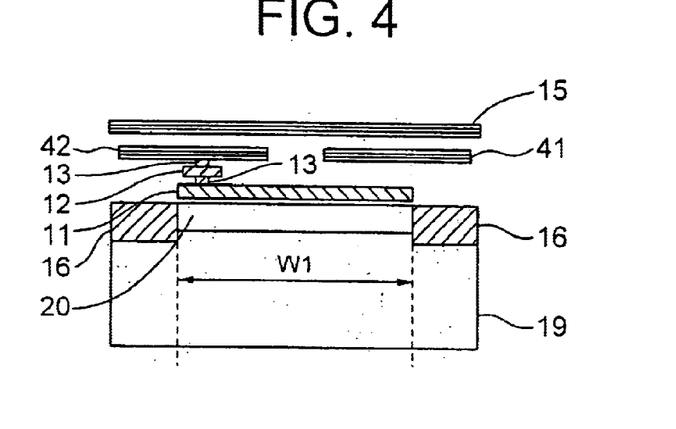
FIG. 4 is a sectional view taken along line IV—IV in FIG. 1.

FIG. 4 is taken along line IV—IV in FIG. 1 for showing the section of the first-level transfer electrode 11 in one of the pairs in the second group (referred to as "second pair" hereinafter), wherein the first- and second-level transfer electrodes 11 and 12 of the second group are connected to the second interconnect line 42 via contact plugs 13. The portion of the transfer channel 17 shown in FIG. 4 constitutes a charge storage section and has a width "W1" equal to the width of the first-level transfer electrode 11.

Figure 5:
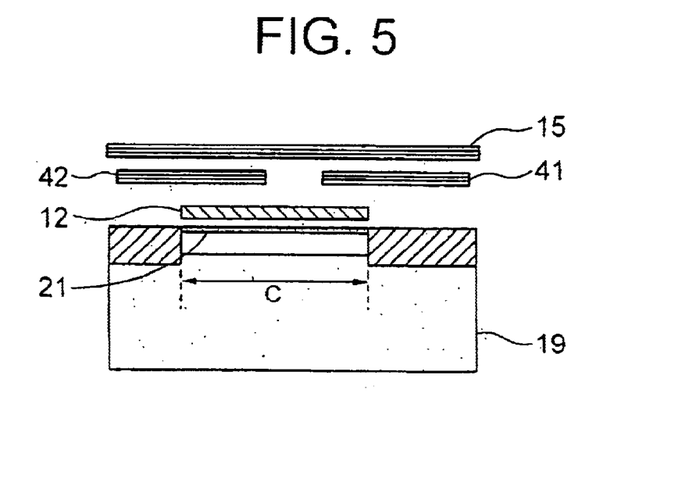
FIG. 5 is a sectional view taken along line V—V in FIG. 1.

FIG. 5 is taken along line V—V in FIG. 1 for showing the section of the second-level transfer electrode 12 in the second pair. The second-level transfer electrode 12 in the second pair is connected to the second interconnect line 42 at the portion shown in FIG. 4. The portion of the transfer channel 17 shown in FIG. 5 constitutes a barrier section having a width "C" equal to the width of the second-level transfer electrode 12. The center of the second-level transfer electrode 12 in the first pair as viewed in the transverse direction of the transfer channel 17 is disposed opposite to the center of the second-level transfer electrode 12 in the second pair with respect to the center of the transfer channel 17 in the widthwise direction.

Figure 6:
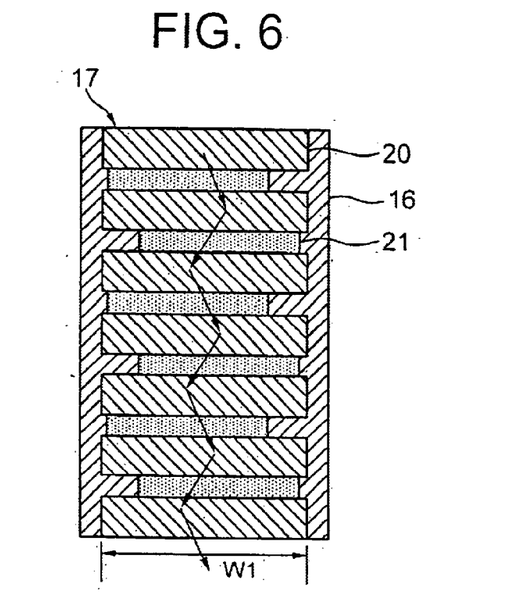
FIG. 6 is a top plan view of the transfer channel underlying the structure shown in FIG. 1.

Referring to FIG. 6, there is shown the transfer channel 17 underling the transfer electrodes 11 and 12, the transfer channel 17 including the n-well 20 and n⁻-wells 21 formed on the surface regions of the n-well 20. The transfer channel 17 is encircled by a p-type diffused region 16 which constitutes a channel stopper. The arrows depicted therein show the transfer direction of the electric charge. It is to be noted that the exposed surfaces of the n-well 20 underlie the first-level electrodes 11, whereas the n⁻-wells underlie the respective second-level transfer electrodes 12. The n-well has a width "W1" at any location whereas the n⁻-well has a width "B" or "C", wherein W1>B or C, and C=B or C≠B. The centers of the n⁻-wells 21 are deviated from the center of the transfer channel 17 as viewed in the transverse direction of the transfer channel 17, and disposed in a staggered arrangement between the first pair and the second pair. The n-well 20 may have different widths corresponding to different widths of the first-level transfer electrodes 11, if any.

Figure 7:
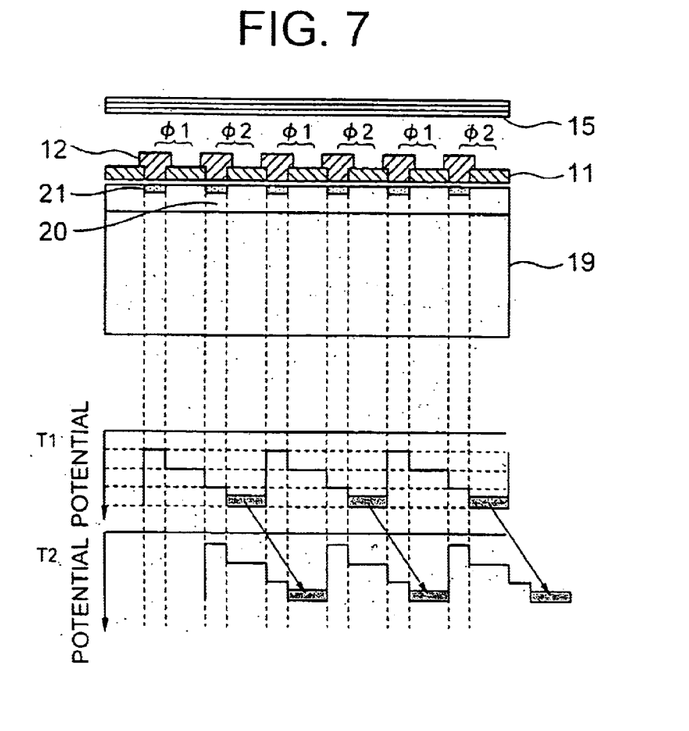
FIG. 7 is a sectional view taken along line VII—VII in FIG. 1, attached with graphs showing the potential distributions of the transfer channel at time instants T1 and T2.

Referring to FIG. 7, there is shown the longitudinal section of the transfer channel 17, wherein the n⁻-well 21 underlying the second-level transfer electrode 12 acts as a barrier section whereas the exposed portion of the n-well 20 underlying the first-level transfer channel 11 acts as a temporary charge storage section. The n⁻-wells 21 are formed by implantation of p-type impurities, such as boron, using a self-alignment technique, i.e., using the first-level transfer electrodes 11 as a mask.

The first- and second-level transfer electrodes 11 and 2 are applied with two-phase clock signals $\phi 1$ and $\phi 2$, which alternately assume high levels. In the potential profile shown in FIG. 7, clock signal $\phi 1$ assumes a low level (0 volt) and clock signal $\phi 2$ assumes a high level (5 volts) at time instant T1, whereas clock signal $\phi 1$ assumes 5 volts and clock signal $\phi 2$ assumes 0 volt at time instant T2. The time instants T1 and T2 shown in FIG. 7 appear alternately.

By using the two-phase driving clock signals $\phi 1$ and $\phi 2$, a potential distribution appears in the transfer channel 17, wherein the potential of the transfer channel 17 reduces monotonically at time T1 from the portion underlying the second-level transfer electrode 11 of the first pair toward the portion underlying the first-level transfer electrode 12 of the first pair, the portion underlying the second-level transfer electrode of the second pair, and the portion underlying the first-level transfer electrode of the second pair. At this time T1, the portion underlying the first-level transfer electrode 11 of the second pair acts as the charge storage section.

At next time T2, the potential of the transfer channel 17 reduces monotonically from the portion underlying the second-level transfer electrode 11 of the second pair toward the portion underlying the first-level transfer electrode 12 of the second pair, the portion underlying the second-level transfer electrode 12 of the first pair, and the portion underlying the first-level transfer electrode 11 of the first pair. At this time T2, the portion underlying the first-level transfer electrode 11 of the first pair acts as the charge storage section. By iterating these alternate potential distributions, electric charge is transferred stepwise in one direction within the transfer channel 17.

In the above two-phase driving scheme, since the surface regions of the n-well 20 underlying the first-level transfer electrode 11 act as the storage sections, a larger width (W1) for the first-level transfer electrode 11 allows the transfer channel 17 to transfer a larger amount of electric charge.

Figure 8:
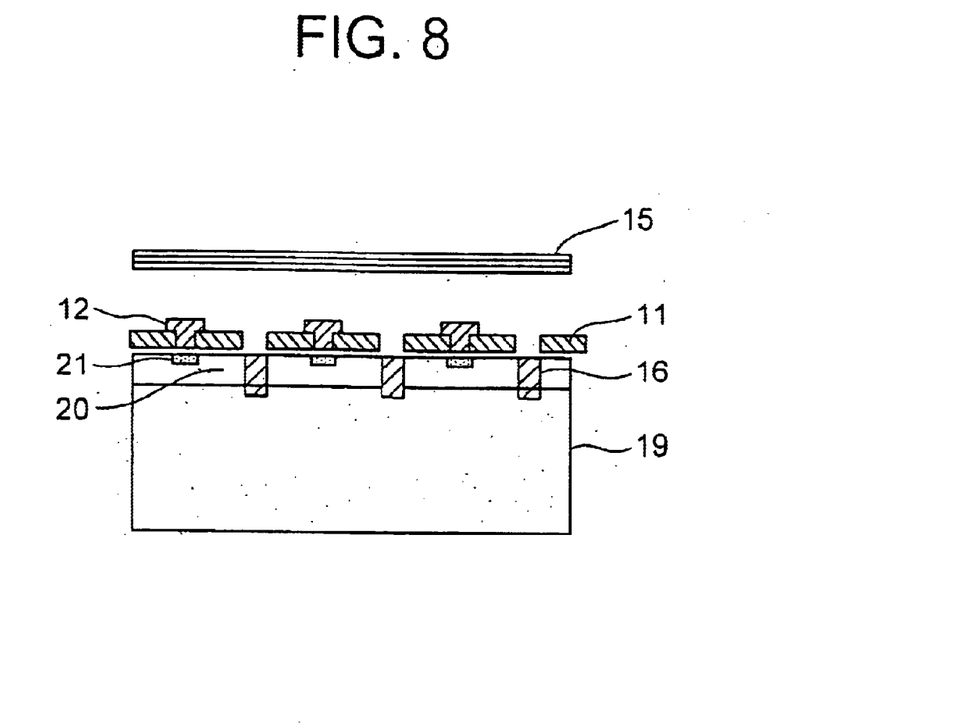
FIG. 8 is a sectional view taken along line VIII—VIII in FIG. 1.

FIG. 8 is taken along line VIII—VIII in FIG. 1, wherein the transfer electrodes 11 and 12 of the second pairs are absent in the depicted portion of the transfer channel 17. The portion of the transfer channel 17 wherein no transfer electrode overlies is formed as the p-type diffused region 16 which acts as a channel stopper for blocking the electric charge. The p-type diffused region 16 is formed by implantation of p-type impurities, such as boron, into the n-well 20 and the n⁻-wells 21 while using the first- and second-level transfer electrodes 11 and 12 as a mask.

The channel stopper is formed in the present embodiment for avoiding the malfunction that the electric charge is left in the portion of the n-well 20 without being transferred because the potential of this portion is not controlled by any of the transfer electrodes 11 and 12 and may be extremely high to stop therein the electric charge.

In the above configuration of the present embodiment, as described above, the width B or C of the n⁻-well 21 underlying the second-level transfer electrode 12, which acts as the barrier section, is smaller than the width W1 of the n-well 20 underlying the first-level transfer electrode 11. The smaller width of the barrier sections 21 does not substantially reduce the maximum electric charge transferred by the transfer channel 17 because the barrier section 21 does not have a function for temporarily storing the electric charge. It is to be noted that the ratio of the width B or C of the portion of the transfer channel 17 underlying the second-level transfer electrode 12 to the width W1 of the portion of the transfer channel 17 underlying the first-level transfer electrode 11 should be preferably about 2:3, in order for achieving an extremely higher transfer rate such as at 5 MHz or above.

Figure 9:
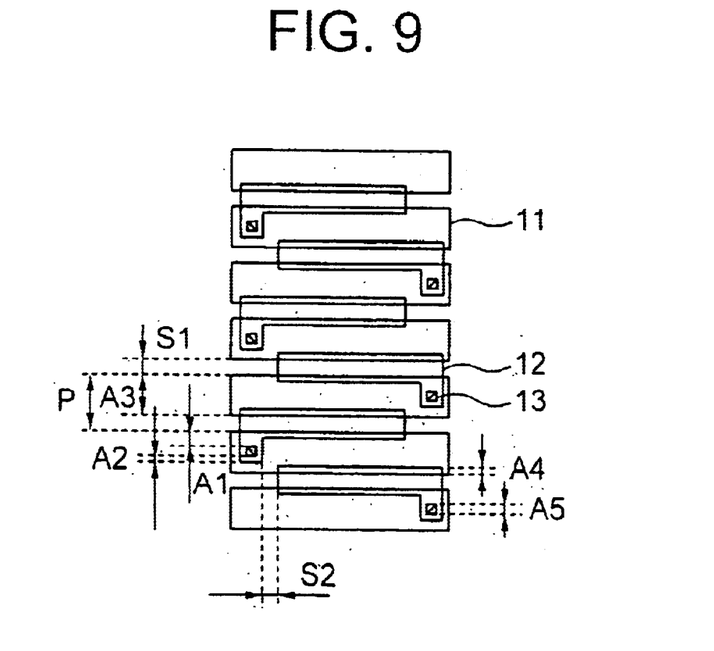
FIG. 9 is another top plan view of the CCD of FIG. 1, including dimensions of the parts of the CCD.

Detailed dimensions are shown in FIG. 9, wherein P, S1, S2, A1, A2, A3, A4 and A5 are the pitch of the combination transfer electrodes 11 and 12, space between adjacent two first-level transfer electrodes 11, space between adjacent two second-level transfer electrodes 12, distance between the contact plug 13 and the edge of the corresponding first-level transfer electrode 11, distance between the contact plug 13 and the edge of the corresponding second-level transfer electrode 12, width of the first-level transfer electrodes 11, dimension of the overlapped portion between the first-level transfer electrode 11 and the second-level electrode 12, and width of the contact plugs 13, respectively. In this case, it is sufficient to assure the relationship P=S1+A3 in the design for the transfer channel 17, thereby allowing reduced dimensions in the design of the CCD. Although this relationship itself is comparable to the case of the comparable example of CCD shown in FIG. 17, the effective width of the transfer channel 17 in the present embodiment can be made larger than the effective width of the comparable example in the case of the same design margin and the pitch of the CCD. Thus, the CCD of the present embodiment can transfer the electric charge in an amount 1.5 to 2.0 times larger the amount of the electric charge transferred by the comparable example shown in FIG. 17.

Figure 10:
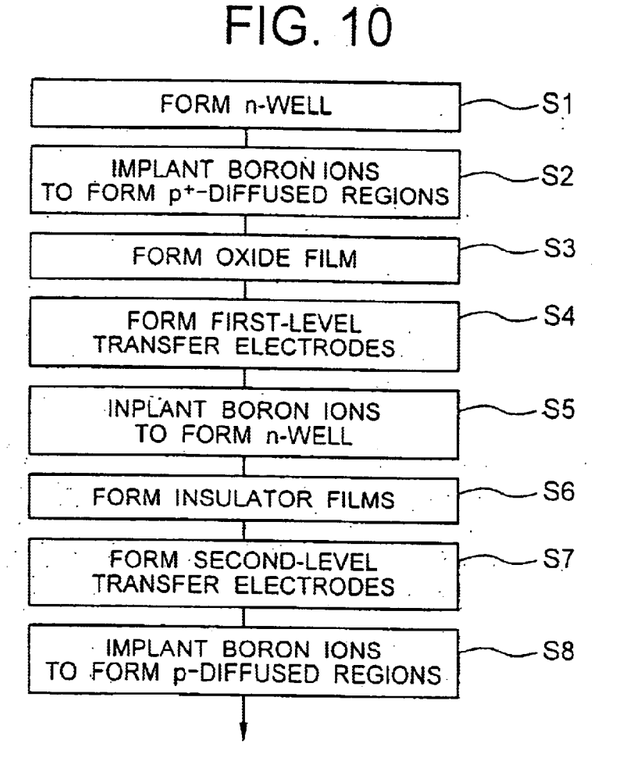
FIG. 10 is a flowchart of a process for manufacturing the CCD of FIG. 1.

Referring to FIG. 10, there is shown a process for manufacturing the CCD of the present embodiment. Step S1 to S7 are similar to steps S1 to S7 shown in FIG. 17. More specifically, the n-well 20 is first formed within a p-well formed in a semiconductor substrate (step S1), followed by implantation of boron ions into the peripheral area of the transfer channel 17 to form the p$^+$-diffused region 16 (step S2). Thereafter, an oxide film is formed over the entire surface of the semiconductor substrate (step S3), followed by depositing a first polysilicon film and patterning thereof to thereby form the first-level transfer electrodes 11 (step S4). Subsequently, boron ions are implanted into surface regions of the n-well 20 in a self-alignment technique using the first-level transfer electrodes 11 as a mask, thereby selectively changing the surface regions of the n-well 21 to the n$^-$-well 21 (step S5). Thereafter, an oxide film and an inter-level dielectric film are formed (step S6), followed by depositing a second polysilicon film and patterning thereof to form the second-level transfer electrodes 12 (step S7).

In the additional step S8 in the process of FIG. 10, p-type diffused regions acting as channel stopper layers 16 are formed by ion-implantation of p-type impurities by using a self-alignment technique using the first- and second-level transfer electrodes 11 and 12.

In the process shown in FIG. 10, for example, the n-well 20 is formed by implantation of phosphorous ions at an acceleration energy of 80 KeV and a dosage of 1E12 cm$^{-2}$, the p-type stopper layers 16 are formed by implantation of boron ions at an acceleration energy of 50 KeV and a dosage of 2E13 cm$^{-2}$, and the n$^-$-wells 21 are formed by implantation of boron ions at an acceleration energy of 50 KeV and a dosage of 8E11 cm$^{-2}$.

Figure 11:
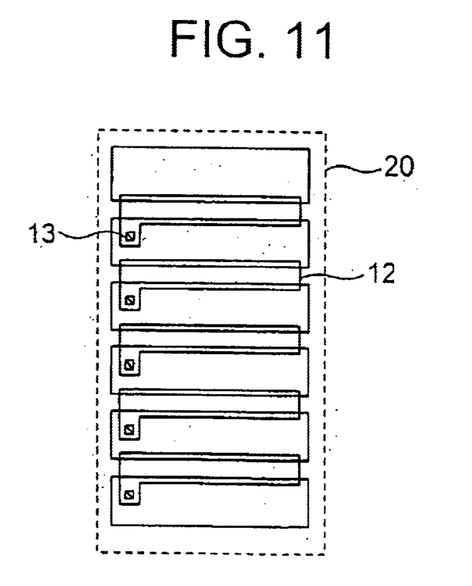
FIG. 11 is a top plan view of a CCD according to a second embodiment of the present invention.
Figure 12:
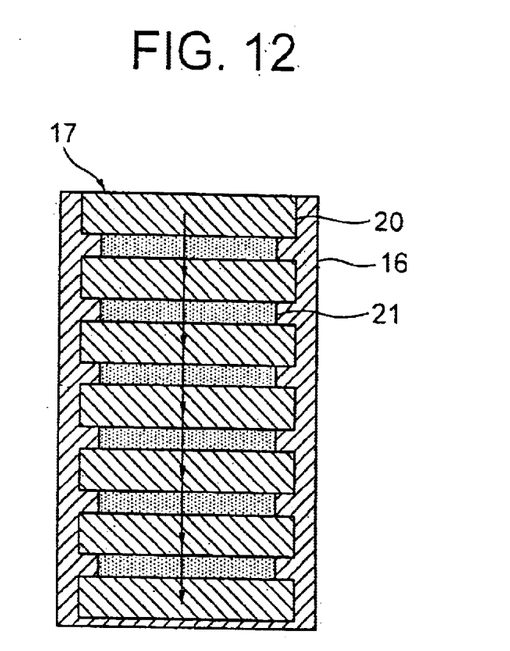
FIG. 12 is a top plan view of the transfer channel underlying the structure shown in FIG. 11.

Referring to FIG. 11, a CCD according to a second embodiment of the present invention is such that the n-well 20 has a width larger than the width of the first-level transfer electrodes 11, the contact plugs 13 are arranged in a single row for the first and second pairs. Referring to FIG. 12, the transfer channel 17 underlying the transfer electrodes shown in FIG. 11 is such that n$^-$-wells 21 are formed on the surface regions of the n-well 20 underlying the second-level transfer electrodes 12, the p-type stopper layers 16 are formed outside the portion of the n-well 20 underlying the first-level transfer electrodes 11 and outside the n$^-$-well 21. The n$^-$-well 21 has a width smaller than the width of the n-well 20. The electric charge is transferred by the transfer channel 17 along a straight line, as shown by arrows in FIG. 12.

The second embodiment of the present invention can be also manufactured by the process shown in FIG. 10.

Figure 13:
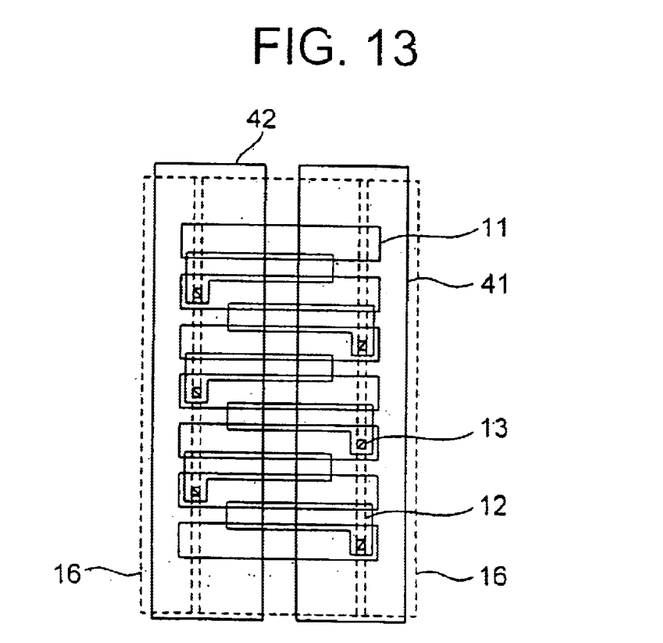
FIG. 13 is a top plan view of a CCD according to a third embodiment of the present invention.

Referring to FIG. 13, a CCD according to a third embodiment of the present invention is such that the n-well 20 has a width smaller than the width of the first-level transfer electrodes 11, and the p-type diffused regions 16 are formed outside the n-well 20. The contact plugs 13 are arranged similarly to the first embodiment.

For manufacturing the CCD of the present embodiment, step S2 in FIG. 10 is modified so that p-type impurities are selectively implanted in the vicinity of the outer periphery of the n-well 20 to change the portion of the n-well 20 to the p-type diffused layer 16. Other steps are similar to those shown in FIG. 10.

Since the above embodiments are described only for examples, the present invention is not limited to the above embodiments and various modifications or alterations can be easily made therefrom by those skilled in the art without departing from the scope of the present invention.

What is claimed is:

1. A charge-coupled device (CCD) comprising:
    a semiconductor substrate having therein a transfer channel on a surface region of said semiconductor substrate;
    a plurality of first transfer electrodes and a plurality of second transfer electrodes overlying said semiconductor substrate and alternately arranged along said transfer channel; and
    first and second interconnect lines for supplying two-phase driving signals to said first and second transfer electrodes to transfer electric charge along said transfer channel, wherein:
    said transfer channel includes a plurality of first diffused regions each underlying a corresponding one of said first transfer electrodes and a plurality second diffused regions each underlying a corresponding one of said second transfer electrodes, said first diffused regions constituting charge storage sections and said second diffused regions constituting barrier sections during transferring the electric charge; and
    each of said charge storage sections has a width larger than a width of each of said barrier sections.

2. The CCD according to claim 1, wherein said first transfer electrodes have a width substantially equal to the width of said charge storage sections, and said second transfer electrodes have a width substantially equal to the width of said barrier sections.

3. The CCD according to claim 1, wherein first contact plugs connecting said first interconnect line to said first and second transfer electrodes and second contact plugs connecting said second interconnect line to said first and second transfer electrodes are located at opposite sides, as viewed in a transverse direction of said transfer channel, with respect to a center line of said transfer channel.

4. The CCD according to claim 3, wherein each of said barrier sections has a center line deviated from said center line of said transfer channel, and adjacent two of said barrier sections have center lines located at opposite sides, as viewed in said transverse direction, with respect to said center line of said transfer channel.

5. The CCD according to claim 1, wherein said charge storage sections and said barrier sections have a first conductivity type, and encircled by a third diffused region having a second conductivity type opposite to said first conductivity type.

6. A method for manufacturing the CCD according to claim 1, said method comprising the step of implanting impurities in said semiconductor substrate by using said first transfer electrodes as a mask to form said barrier sections.

7. A method for manufacturing the CCD according to claim 1, said method comprising the step of implanting impurities in said semiconductor substrate by using said first and second transfer electrodes as a mask to form said third diffused region.

* * * * *